(12) United States Patent
Carey et al.

(10) Patent No.: US 9,177,576 B2
(45) Date of Patent: Nov. 3, 2015

(54) GIANT MAGNETO RESISTIVE SENSOR AND METHOD FOR MAKING SAME

(71) Applicant: HGST Netherlands B.V., Amsterdam (NL)

(72) Inventors: Matthew Joseph Carey, San Jose, CA (US); Jeffrey Robinson Childress, San Jose, CA (US); Young-suk Choi, Los Gatos, CA (US); Goran Mihajlovic, San Jose, CA (US); John Creighton Read, San Jose, CA (US); Neil Smith, San Jose, CA (US)

(73) Assignee: HGST NETHERLANDS B.V., Amsterdam (NL)

( * ) Notice: Subject to any disclaimer, the term of this patent is extended or adjusted under 35 U.S.C. 154(b) by 65 days.

(21) Appl. No.: 14/045,349

(22) Filed: Oct. 3, 2013

(65) Prior Publication Data

US 2015/0098153 A1  Apr. 9, 2015

(51) Int. Cl.
| | |
|---|---|
| *G11B 5/39* | (2006.01) |
| *C23C 28/02* | (2006.01) |
| *G01R 33/00* | (2006.01) |
| *G01R 33/09* | (2006.01) |
| *C23C 14/16* | (2006.01) |
| *B82Y 10/00* | (2011.01) |

(52) U.S. Cl.
CPC ............ *G11B 5/3912* (2013.01); *C23C 14/165* (2013.01); *C23C 28/021* (2013.01); *G01R 33/00* (2013.01); *G01R 33/093* (2013.01); *G01R 33/098* (2013.01); *B82Y 10/00* (2013.01); *G11B 2005/3996* (2013.01); *Y10S 977/943* (2013.01)

(58) Field of Classification Search
CPC ................. G11B 5/3912; Y10T 29/49032

USPC .......................................... 360/235.4, 324.11
See application file for complete search history.

(56) References Cited

U.S. PATENT DOCUMENTS

| | | | |
|---|---|---|---|
| 6,697,236 B2 | 2/2004 | Gill | |
| 7,420,787 B2 | 9/2008 | Freitag et al. | |
| 7,599,155 B2 * | 10/2009 | Saito et al. | 360/324.11 |

(Continued)

FOREIGN PATENT DOCUMENTS

EP    1 566 651 A1    8/2005

OTHER PUBLICATIONS

Dodrill et al, "Magnetic in-line metrology for GMR spin-valve sensors," Lake Shore Cryotronics, Inc.; Retrieved from <http://www.lakeshore.com/Documents/DataTech%20GMR.pdf> on Aug. 15, 2013: 1-11.

*Primary Examiner* — Angel Castro
(74) *Attorney, Agent, or Firm* — Billion & Armitage; Richard E. Billion

(57) ABSTRACT

A disk drive includes a disk including a magnetizable layer of material, and a transducer. The transducer has a read element that includes a first shield layer, a pinned layer, a metallic spacer, an AP (anti-parallel) free layer, and a second shield layer. The pinned layer has a surface area which is greater than the area of the AP free layer. The read element also includes an anti-ferromagnetic layer for substantially fixing the magnetic orientation of a plurality of domains in the pinned layer. The ferromagnetic layer is adjacent the pinned layer. The pinned layer, and the anti-ferromagnetic layer both have surface areas which are greater than the area associated with the AP free layer. The anti-ferromagnetic layer, in one embodiment, has a pinning strength in the range of 0.5 erg/$cm^2$ to 1.5 erg/$cm^2$.

14 Claims, 7 Drawing Sheets

(56) References Cited

U.S. PATENT DOCUMENTS

| | | |
|---|---|---|
| 7,602,589 B2 | 10/2009 | Freitag et al. |
| 7,646,569 B2 | 1/2010 | Li et al. |
| 7,652,856 B2 * | 1/2010 | Pinarbasi .................. 360/324.11 |
| 7,663,846 B2 * | 2/2010 | Freitag et al. ............ 360/324.11 |
| 8,305,716 B2 | 11/2012 | Fukuzawa et al. |
| 8,335,056 B2 | 12/2012 | Balamane et al. |
| 8,351,165 B2 | 1/2013 | Carey et al. |
| 8,675,318 B1 * | 3/2014 | Ho et al. ................... 360/324.11 |
| 8,760,822 B1 * | 6/2014 | Li et al. .................... 360/324.11 |
| 2008/0180863 A1 * | 7/2008 | Gill ............................ 360/324.2 |
| 2010/0102406 A1 | 4/2010 | Xi et al. |
| 2012/0276415 A1 * | 11/2012 | Sapozhnikov et al. ........ 428/831 |
| 2015/0062752 A1 * | 3/2015 | Hong et al. ................. 360/234.3 |

\* cited by examiner

GIANT MAGNETO RESISTIVE SENSOR AND METHOD FOR MAKING SAME

TECHNICAL FIELD

Various embodiments described herein relate to a giant magneto resistive (GMR) sensor or transducing head and a method for making the same.

BACKGROUND

A disk drive is an information storage device. The most basic parts of a disk drive are an information storage disk that is rotated, an actuator that moves a slider carrying one or more transducers to various locations over the disk, and electrical circuitry that is used to write and read data to and from the disk. The one or more information storage disks are clamped to a rotating spindle. More specifically, storing data includes writing information representing the data to portions of tracks on a disk. The transducer includes two separate devices—a write transducer that writes information representing data to the disk and a read transducer or sensor that reads information from the disk.

The slider is a small ceramic block that carries the one or more transducers. The slider is aerodynamically designed so that it flies over the disk. The slider is passed over the disk in a transducing relationship with the disk. Most sliders have an air-bearing surface ("ABS") which includes rails and a cavity between the rails. When the disk rotates, air is dragged between the rails and the disk surface causing pressure, which forces the head away from the disk. At the same time, the air rushing past the cavity or depression in the air bearing surface produces a negative pressure area. The negative pressure or suction counteracts the pressure produced at the rails. The slider is also attached to a load spring which produces a force on the slider directed toward the information disk surface. The various forces equilibrate so the slider flies over the surface of the information disk at a particular desired fly height. The fly height is the distance between the information disk surface and the one or more transducing heads, which is typically the combined thickness of the air gap and lubricant film. This film eliminates the friction and resulting wear that would occur if the transducing head and disk were in mechanical contact during disk rotation.

Data retrieval includes reading the information representing data from the portion of the track on which the information representing data was stored. The read transducer or sensor is housed within a slider which is flown or passed over the disk at a height where the transducer can read information from the disk. The slider is attached to actuator. The actuator positions the read sensor or transducer over a track having the desired information. The actuator rotates the slider and read sensor or transducer over the track containing the desired information, in another embodiment, the actuator is moved linearly. A voice coil motor drives the actuator.

The disk drive also includes circuitry for encoding data so that it can be successfully written to the disk surface, and subsequently decoding the information retrieved from the disk so that the information can be replicated. A microprocessor controls most of the operations of the disk drive as well as passing the data back to the requesting computer and taking data from a requesting computer for storing to the disk. The electronics used to encode and write information representing data, and to decode the read information is generally referred to as the read/write channel.

There are many types of read sensors or transducers. These may also be referred to as read elements. In the past, there were metal in gap heads. More recently, the read sensors have been separate from the write transducers. The types of read sensors more common these days are magneto resistive (MR) sensors, tunneling magneto resistive (TMR) sensors, and giant magneto resistive (GMR) sensors.

The most common type of write transducer is a thin film head. These can be formed on a wafer using semiconductor process techniques. In many instances, the read elements can also be formed using semiconductor process techniques. In many instances, the write transducer is formed on a first layer and the read element is formed on another layer on top of the wafer. The wafer is diced and further processed to form the slider which carries the read transducer and the write transducer.

SUMMARY

A disk drive includes a disk including a magnetizable layer of material, and a transducer. The disk drive includes a mechanism for placing the transducer in transducing relation with respect to the disk. The transducer has a read element that includes a first shield layer, a pinned layer, a spacer layer, an AP (anti-parallel) free layer, and a second shield layer. The pinned layer has a surface area which is greater than the area of the AP free layer. The read element also includes an anti-ferromagnetic layer for substantially fixing the magnetic orientation of a plurality of domains in the pinned layer. The ferromagnetic layer is adjacent the pinned layer. The pinned layer, and the anti-ferromagnetic layer both have surface areas which are greater than the area associated with the AP free layer. The anti-ferromagnetic layer, in one embodiment, has a pinning strength in the range of 0.5 erg/cm$^2$ to 1.5 erg/cm$^2$.

A method for forming a giant magneto resistive sensor includes depositing layers of material on a substrate. The layers of material include a first shield layer, a pinned layer, a spacer layer, an AP (anti-parallel) free layer, and a second shield layer. The method also includes removing a portion of the AP free layer deposited to produce a structure where the pinned layer has a surface area that is larger than the AP free layer. In one embodiment of the method, the layers from a stack and removing the portion of the free layer further includes masking a portion of the stack of deposited layers, and ion milling the unmasked portion of the stack of deposited layers. The mask, in one embodiment, is placed over a portion of the stack that will become an air bearing surface. The removed portion of the stack is replaced with an insulating material. Depositing the antiferromagnetic layer includes sputtering IrMn onto the substrate at a temperature in the range of 240 degrees C. to 260 degrees C. In some embodiments, is done in an environment having a temperature in the range of 240 degrees C. to 260 degrees C., and in the presence of Kr gas. In another embodiment, the environment includes Ar gas, or a similar gas. The final desired film composition is approximately Ir(21 atomic %)Mn(79 atomic %)

BRIEF DESCRIPTION OF THE DRAWINGS

The embodiments will be readily understood by the following detailed description in conjunction with the accompanying drawings, wherein like reference numerals designate like structural elements, and in which.

DETAILED DESCRIPTION

In the following paper, numerous specific details are set forth to provide a thorough understanding of the concepts underlying the described embodiments. It will be apparent, however, to one skilled in the art that the described embodiments may be practiced without some or all of these specific details. In other instances, well known process steps have not been described in detail in order to avoid unnecessarily obscuring the underlying concepts.

Figure 1:
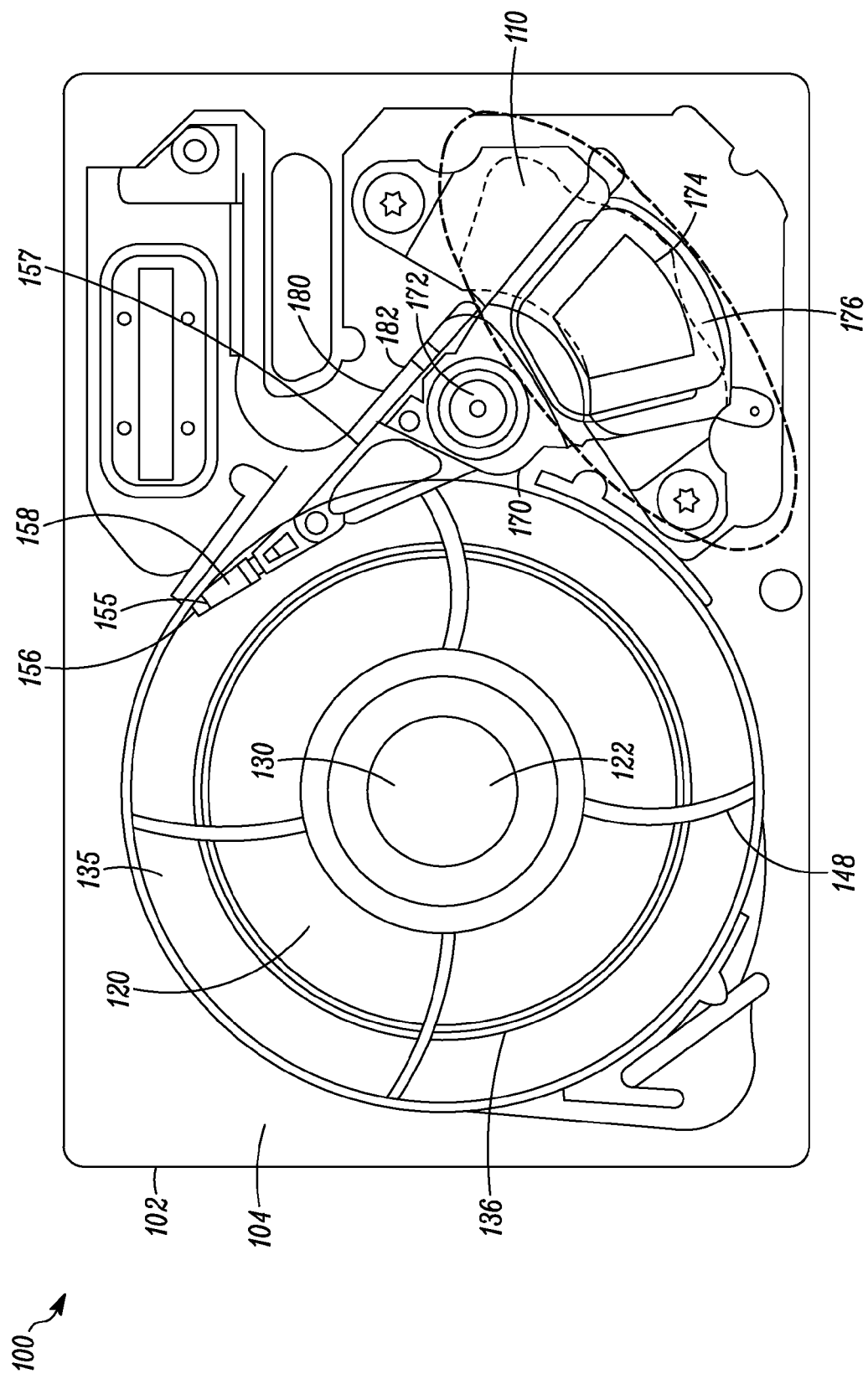
FIG. 1 is a top view of a disk drive, according to an embodiment of the invention.

FIG. 1 is a top view of disk drive 100 that uses various embodiments of the present invention. The disk drive 100 includes a housing 102 including a housing base 104 and a housing cover (not shown). The housing base 104 and the housing cover generally form a disk enclosure. The housing base 104 illustrated is a base casting, but in other embodiments a housing base 104 can comprise separate components assembled prior to, or during assembly of the disk drive 100. A disk 120 is attached to a hub or spindle 122 that is rotated by a spindle motor (not shown). The disk 120 can be attached to the hub or spindle 122 by a clamp. The hub or spindle 122, and the spindle motor form a motor-hub assembly 130. The disk 120 may be rotated at a constant or varying rate ranging from less than 3,600 to more than 17,000 revolutions per minute. Higher rotational speeds are contemplated in the future. The spindle motor is connected with the housing base 104. The disk 120 can be made of a light aluminum alloy, ceramic/glass or other suitable substrate, with magnetizable material deposited on one or both sides of the disk. The magnetic layer includes small domains of magnetization for storing information representing data. In some disk drives the data is written with magnetic transitions parallel to a major surface 135 of the disk. In other disk drives, the data is written with magnetic transitions perpendicular to a major surface 135 of the disk 120. The information is written to the disk 120 along a track 136 using a magnetic transducer 156. Tracks, such as track 136, is shown as one concentric circle on the major surface 135 of the disk 120. The magnetic transducer 156 is generally held in transducing relation to the disk 120 by an actuator assembly 157. The actuator assembly 157 includes a rotary actuator 160, a suspension 158, and a slider 155. One end of the suspension 158 is attached to an arm of the rotary actuator 170. The slider 155 is attached to the other end of the suspension 158. The suspension 158, in some embodiments, is a spring which forces the suspension toward the major surface 135 of the disk 120. When the disk 120 spins, fluid, such as air, is passed over the air bearing surface of the slider 155 and produces a force having a component which counteracts the force of the suspension 158.

The rotary actuator 170 is pivotally mounted to the housing base 104 by a bearing 172 and sweeps an arc between an inner diameter (ID) of the disk 120 and a position near an outer diameter (OD) of the disk 120. Attached to the housing 104 are upper and lower magnet return plates 110 and at least one magnet that together form the stationary portion of a voice coil motor (VCM) 174. A voice coil 176 is mounted to the rotary actuator 170 and positioned in an air gap of the VCM 174. The rotary actuator 170 pivots about the bearing 172 when current is passed through the voice coil 176 and pivots in an opposite direction when the current is reversed, allowing for control of the position of the actuator 170 and the attached slider 155. The magnetic transducer 156 is located at or near the trailing edge of the slider 155 at an air bearing surface (shown in FIG. 2).

Figure 2:
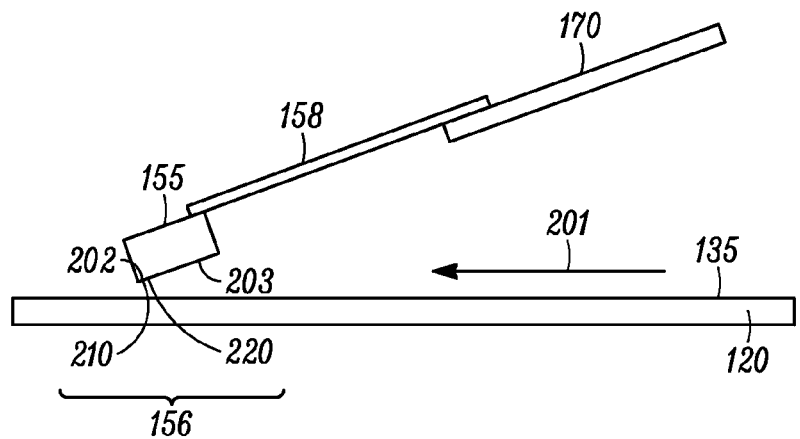
FIG. 2 shows a schematic side view of a suspension, slider and disk of a disk drive, according to an example embodiment.

The slider 155 includes a read element 210 and a separate write element 220 (shown in FIG. 2). The write element 220 can be any type of write element. In this embodiment, the write element 220 is a thin film head. The separate read element or sensor 210 is a giant magneto-resistive head, also known as a magneto resistive ("MR") head. A Giant Magneto Resistive head is a read sensor or read transducer that exhibits a giant magnetoresistance effect. Giant magnetoresistance (GMR) is a quantum mechanical magnetoresistance effect observed in thin-film structures composed of alternating ferromagnetic and non-magnetic conductive layers. The 2007 Nobel Prize in Physics was awarded to Albert Fert and Peter Grunberg for the discovery of GMR. The effect is observed as a significant change in the electrical resistance depending on whether the magnetization of adjacent ferromagnetic layers are in a parallel or an antiparallel alignment. The overall resistance is relatively low for parallel alignment and relatively high for antiparallel alignment. The magnetization direction can be controlled, for example, by applying an external magnetic field. The effect is based on the dependence of electron scattering on the spin orientation.

The write element 220 and the read sensor or element 210 are carried by the slider 155. VCM 174 is coupled with a servo system that uses positioning data read by the read element 210 from the disk 120 to determine the position of the read element 210 and the write element 220 over one of a plurality of tracks, such as track 136, on the disk 120. The servo system determines an appropriate current to drive through the voice coil 176, and drives the current through the voice coil 176 using a current driver and associated circuitry Each side of a disk 120 can have an associated head or slider 155, and the sliders 155 are collectively coupled to the rotary actuator 170 such that the sliders 155 pivot in unison. The invention described herein is equally applicable to devices wherein the individual heads separately move some small distance relative to the actuator. This technology is referred to as dual-stage actuation (DSA).

One type of servo system is an embedded servo system in which tracks on each disk surface used to store information representing data contain small segments of servo information. The servo information, in some embodiments, is stored in radial servo sectors or servo wedges shown as several narrow, somewhat curved spokes 148 substantially equally spaced around the circumference of the disk 120. It should be noted that in actuality there may be many more servo wedges than as shown in FIG. 1. In some embodiments, there is a servo wedge every three degrees or 120 servo wedges 148 in the disk. Of course, for different embodiments, there may be more or less servo wedges on or in the surface of the disk. This type of servo is known as embedded servo.

The plurality of tracks, such as track 136, are traversed by the servo wedges 148. The plurality of tracks, in some embodiments, may be arranged as a set of substantially concentric circles. Data is stored in fixed sectors along a track between the embedded servo wedges, such as servo wedge 148. The tracks 136 on the disk are divided into portions of a track having a fixed block length and a fixed data storage capacity (e.g. 512 bytes or 4 kilobytes of user data per data sector). The tracks toward the inside of the disk 120 are not as long as the tracks toward the periphery of the disk 120. As a result, the tracks toward the inside of the disk 120 cannot hold as many data sectors as the tracks toward the periphery of the disk 120. Tracks that are capable of holding the same number of data sectors are grouped into a data zones. Since the density and data rates vary from data zone to data zone, the servo wedges 148 may interrupt and split up at least some of the data sectors. The servo sectors 148 are typically recorded with a servo writing apparatus at the factory (called a servo-writer), but may be written (or partially written) with the disk drive's 100 write head 220, and more specifically the write element, in a self-servo-writing operation.

The disk drive 100 not only includes many mechanical features and a disk with a servo pattern thereon, but also includes various electronics to enable reading signals from the disk 120 and writing information representing data to the disk 120. Signals carrying the information to write to a disk 120 and signals as read from the disk 120 travel over electrical conductors 180 attached to the read sensor or read element 210 and write element 220. The conductors 180 can be formed in a flex cable, such as flex cable 182. It should be noted that only one disk 120 is visible in FIG. 1 but that disk drives may include a plurality of disks 120 attached to the spindle and spun in unison. Each disk 120 includes two magnetizable major surfaces, such as disk surface 135, for holding information representing data.

FIG. 2 shows a schematic side view of a a portion of the actuator assembly 157, according to an example embodiment. Shown in FIG. 2 is the suspension 158, slider 155, arm of the actuator 170, and disk 120 of a disk drive 100 (shown in FIG. 1. The disk 120 rotates in the direction of the arrow 201. This produces relative motion between the disk 120 and the slider 155 so that the slider 155 is placed in transducing relationship with respect to the disk 120. Transducing relationship is a position between the disk 120 and the transducer or transducers in the slider 155 where the transducers can write information representing data to the disk 120, or can read information from the disk 120. In other words, the slider 155 passes over the disk 120 on a thin layer of fluid. The thin layer of fluid may be air or other gas such as Helium and may include some other lubricant on the disk 120. The lubricant can be a polymer that is stationary on the disk. It should be noted that the slider may pick up some of the lubricant during operation. The slider 155 includes an air bearing surface (ABS) 203. The air bearing surface 203 gets its name from the thin layer of fluid, such as air or other gas, on which the slider rides during operation. The air or gas is within the disk enclosure or housing of the disk drive 100. The air bearing surface 203 is the surface of the slider that faces the major surface 135 of the disk 120. The slider 155 also includes a trailing edge 202. The magnetic transducer 156, as mentioned above, is positioned near the trailing edge 202 of the slider 155. Also shown is that the magnetic transducer 156, in this embodiment, includes a read sensor or element 210 and a write element 220. The read sensor or element 210 and the right element 220 include a portion which forms the air bearing surface 203 of the slider 155.

Figure 3:
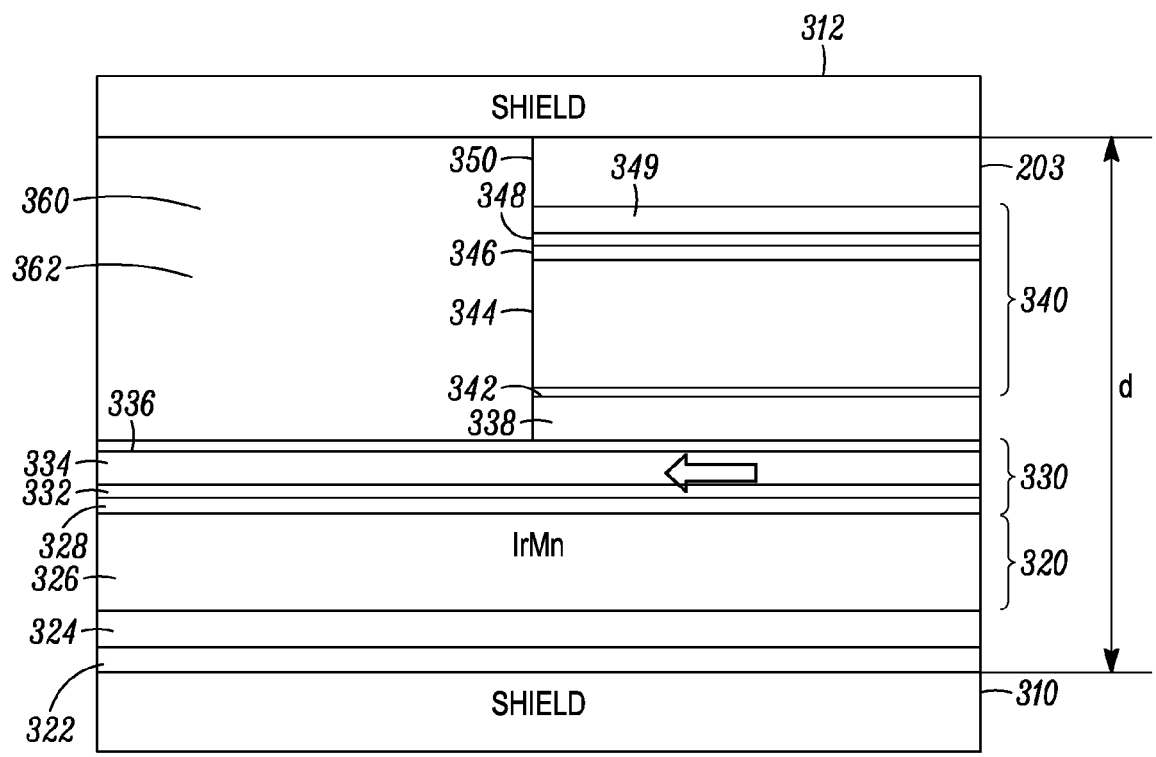
FIG. 3 is a cut away side view of a GMR read sensor, according to an example embodiment.

FIG. 3 is a cut away side view of a giant magneto resistive (GMR) read sensor or read element 210, according to an example embodiment. The read element 210 is a specific type of giant magneto resistive read element, known as a current perpendicular to plane (CPP) GMR read sensor or read element. This type of sensor is also known as a spin-valve because it comprises a magnetically fixed layer, also known as a reference or pinned layer, and a free magnetic layer, also known as the sense layer, separated by a non-magnetic spacer layer. It is the rotation of the magnetization of the free layer, in contrast to the fixed magnetization direction of the pinned layer, which provides a change in electrical resistance that results in the detection of magnetic fields from the disk. The read element 210 includes a first shield 310 and a second shield 312. The shields are typically formed from a soft magnetic alloys such as $Ni_{80}Fe_{20}$. Situated between the first shield 310 and the second shield 312 area a number of layers that form the read element 210. The layers, in one embodiment, are all metal so that they can conduct a current during read operations. The various layers form sub elements of the read element 210. The sub elements of the read element 210 include an anti-ferromagnetic layer (AFM) 320, a simple pinned reference layer (RL) 330, and an anti-parallel free layer (AP-FL) 340.

More specifically, the layers are placed onto an aluminum titanium carbide (AlTiC) substrate which has been covered with an insulator such as $Al_2O_3$ and polished smooth via chemical-mechanical polishing (CMP). The first shield 310 is deposited onto the substrate by electrodeposition, and typically patterned by standard photolithography into specific shapes or regions on the substrate. The first shield 310 is then typically also polished smooth by a CMP process. To form the layers of the read element 210, metallic thin films are sequentially deposited on first shield 310 by a vacuum vapor deposition process, such as magnetron sputtering deposition. An underlayer 322, a seed layer 324, and an antiferromagnet 326 are placed on to the first shield 310. The underlayer 322 (5-30 A thick, typically 15 A) provide adhesion and promotes proper crystalline growth, and preferentially comprise one or more of Ta, Ti or Cr. Alternatively, the shield 310 is specially prepared to allow the omission of underlayer 322. Seed layer 324 provide the appropriate substrate for the growth of the antiferromagnet 326, and preferentially comprise one or more of Ru, Cu, or NiFe. Seed layer 324 has a thickness of 10-40 A, typically 20 A. The antiferromagnet 326 is typically a layer of iridium manganese, but may instead include PtMn, NiMn, OsMn. The thickness of this layer is 20 A-150 A, typically 50 A. A thin magnetic layer interface layer 328 such as Co, Fe or their alloys may be placed on the layer of iridium manganese 326 to provide improved exchange coupling to the reference layer 330. Layer 328 is 2 A-10 A thick, typically 5 A.

The reference layer (RL) 330 provides the fixed layer in the spin-valve sensor. While the RL behaves magnetically as a single layer, it can be formed of a multitude of individual layers with unique compositions and thicknesses. In one embodiement, the RL is formed of three distinct layers. A first layer 332, a second layer 334, and a third layer 336 are then laid on top of the interface layer 328. The first layer 332 is a pinning layer, typically a $Co_{1-x}Fe_x$ alloy, where x is preferable between 20 and 50%. The thickness of the first layer is between 4 A and 25 A, typically 15 A. The second layer 334 is a magnetoresistive layer, whose function is to maximize the magnetoresistive response of the sensor. Second layer 334 preferable comprises a magnetic alloy with high spin polarization, such as $(Co_{50}Fe_{50})_{1-x}(M)$, where M is one or more of Ge, Al, Ga, Si, or a magnetic Heusler alloy, such as $Co_2(Y)(Z)$, where Y is one or more of Mn,Fe and Z is one or more of Ge, Al, Si, Ga, Sn. Alternatively the second layer 334 can be an alloy of Co, Fe and Ni. The thickness of the second layer is between 10 A and 40 A, typically 25 A. The third layer 336 is an interface layer, whose function is to provide an adequate interface to the spacer layer 338. The thirds layer 336 is typically a $Co_{1-x}Fe_x$ alloy, where x is preferably between 0 and 50%. The thickness of the third layer is between 2 A and 15 A, typically 10 A. It should be noted that there is only one pinned reference layer 330 in this simple-pinned design. There is no other layer that couples anti-parallel to the reference layer 330, as in an AP-pinned design. The anti-ferromagnetic layer 320 produces a pinning force which pins or magnetically orients the domains in the simple pinned reference layer 330 in a certain way to form the simple pinned reference layer. A spacer layer 338 is then placed over the interface layer 336. Spacer layer 338 is a non-magnetic metallic layer typically of Cu, Ag, Au or their alloys. The thickness of the spacer layer 338 is 15-40 A, typically 25 A.

The next several layers form the anti-parallel free layer or AP-free layer 340. The purpose of the AP-free layer 340 is to acts as the sense layer of the spin-valve read sensor, and to resist the effects of spin-torque excitations. These layers include a first magnetic layer 342, a second magnetic layer 344, a third magnetic 346, a fourth non-magnetic layer 348, and fifth magnetic layer 349. Alternatively layers 342, 344 and 346 can be replaced by a single magnetic layer. These layers form the AP free layer 340. Magnetic layer 342 is an interface layer, whose function is to provide an adequate interface to the spacer layer 338. Layer 342 is typically a $Co_{1-x}Fe_x$ alloy, where x is preferably between 0 and 50t %. The thickness of this layer is between 2 A and 15 A, typically 10 A. Magnetic layer 344 preferably comprises a magnetic alloy with high spin polarization, such as $(Co_{50}Fe_{50})_{1-x}(M)_x$ where M is one or more of Ge, Al, Ga, Si, or a magnetic Heusler alloy, such as $Co_2(Y)(Z)$, where Y is one or more of Mn, Fe and Z is one or more of Ge, Al, Si, Ga, Sn. The thickness of magnetic layer 344 is between 15 A and 60 A, or about 40 A. Alternatively layer 344 can be an alloy of Co, Fe and Ni. Magnetic layer 346 is another interface layer, whose function is to provide an adequate interface to the non-magnetic coupling layer 348. Layer 348 is a non-magnetic layer with thickness between 4 A and 20 A, which provides the antiparallel exchange coupling between layers 346 and 349. Layer 348 is preferably Ru, but may be other coupling layers such as Cr, Jr or Rh. Layer 349 is a magnetic layer which is coupled with its magnetization antiparallel to layer 346. Layer 349 may be an alloy of Co, Fe, Ni, with thickness between 8 and 20 A, typically 12 A. Alternatively layer 349 may be formed from a multilayer of distinct magnetic layers with different compositions. The next layer is a cap layer 350 and a second shield layer 312. Cap layer 350 is a non-magnetic layer, typically Ru, Ta or Ti, or their alloys. The thickness of cap layer 350 is between 20 A and 50 A, typically 30 A. When a current is passed through the read element 220 from the first shield 310 to shield 312, the magnetic orientation of the domains in the AP free layer 340 change slightly in response to the ones and zeros representing information recorded on the disk 120. This slight change in magnetic orientation changes the resistance from the first shield to the second shield, which in turn affects the signal output from the read element 210. The change in the signal output can then be used to determine whether the transition below the read element 210 is a one or zero. Also shown in FIG. 3 is that the read element 210 is positioned along the air bearing surface (ABS) 203 of the slider 155. It should be noted that in one embodiment, the layers of material between the pinned layer and the second shield layer are metal layers.

Figure 4:
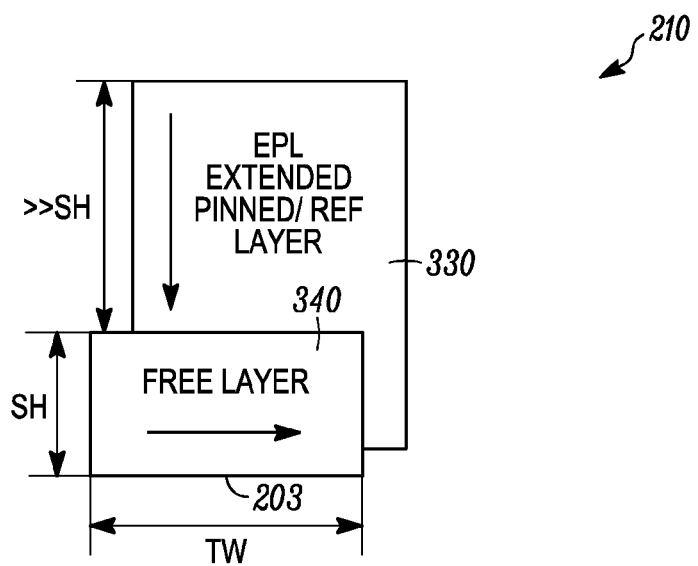
FIG. 4 is another side view of a GMR read sensor showing the relationship between the size of the AP free layer and the pinned layer, according to an example embodiment.

It should be noted that the simple pinned reference layer 330 and the anti-ferromagnetic layer 320, each has a greater area or volume than the AP free layer 340. This is also shown schematically in FIG. 4 which is another side view of a GMR read sensor 210 showing the relationship between the size of the AP free layer 340 and the pinned layer 330, according to an example embodiment. As shown in FIG. 4, the AP free layer 340 has a stripe height dimension SH. The simple pinned layer 330 has a stripe height dimension which is greater than SH. In this particular embodiment the stripe height of the simple pinned layer 330 is approximately 5 times or more the stripe height of the free layer 340. The stripe height of the simple pinned layer 330 is in a range of 3.0-7.0 times the stripe height of the free layer 340. In another embodiment, the stripe height of the simple pinned layer 330 is in a range of 4.0-6.0 times the stripe height of the free layer 340. In still another embodiment, the stripe height of the simple pinned layer 330 is in a range of 4.5-5.5 times the stripe height of the free layer 340. The simple pinned layer 330 can also be referred to as an extended pinned/reference layer when compared to the stripe height of the AP free layer 340.

Referring once again to FIG. 3, the space 360 is filled with an insulating material 362, such as $Al_2O_3$, AN, $Si_3N_4$, or $Ta_2O_5$. The insulating material 362 is placed into the space 360 before the second shield 312 is placed onto the read element 210.

FIG. 3 shows the read element as it appears or would be in a substantially finished magnetic transducer 156. Forming the read sensor element 210 shown in FIG. 3 can be done in any of a number of ways. Now referring to FIGS. 5 and 6, one embodiment of the manufacturing process for forming the read element 210 will be discussed.

Figure 5:
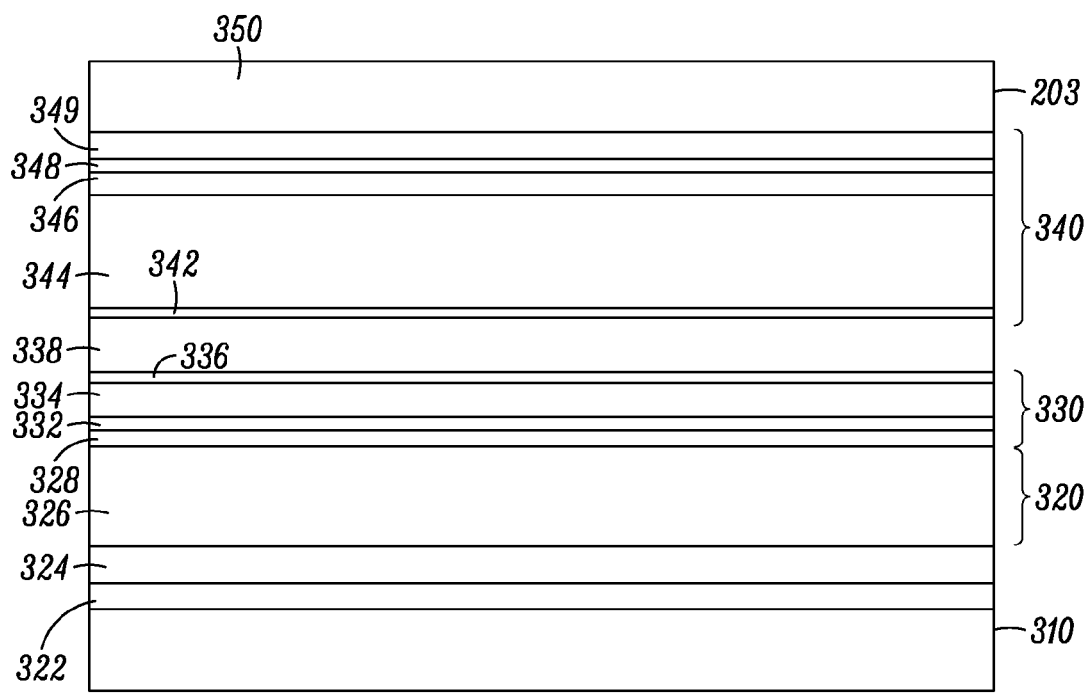
FIG. 5 shows the device at a time during the manufacture of the read sensor or element, according to an example embodiment.

FIG. 5 shows the device at a time during the manufacture of the read sensor or element 210, according to an example embodiment. In actuality, a number of sliders are manufactured all at one time on a six inch wafer that includes a surface on which to add the various layers of materials. In one embodiment, the materials or layers of materials are sputtered onto the substrate at a plurality of sites on the six inch wafer. One of the sites is shown in FIG. 5. Initially all the layers 310, 322, 324, 326, 328, 332, 334, 336, 338, 342, 344, 346, 348, 349 and 350 are deposited are sputtered onto the substrate. All these layers 310, 322, 324, 326, 328, 332, 334, 336, 338, 342, 344, 346, 348, 349 and 350 form a stack. A portion of the stack is masked.

Figure 6:
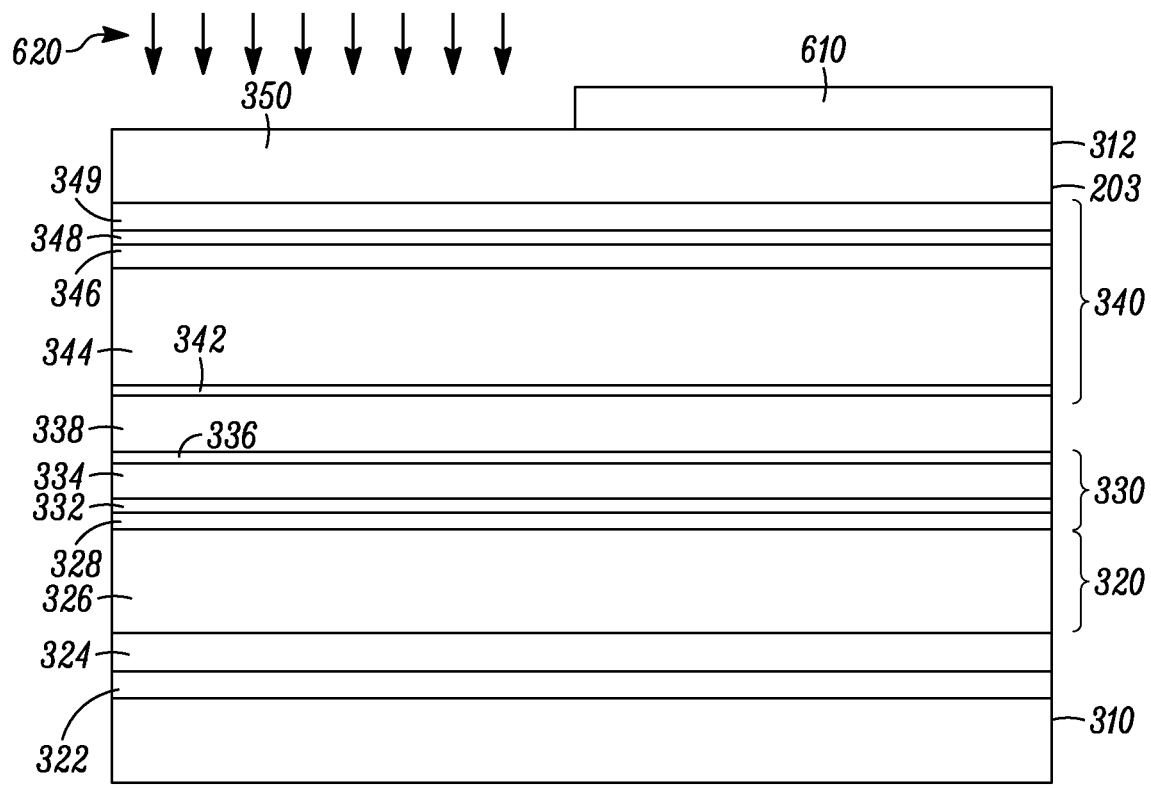
FIG. 6 shows the device at another time during the manufacture of the read sensor or element, according to an example embodiment.

FIG. 6 shows the device at another time during the manufacture of the read sensor or element 210, according to an example embodiment. After the stack has been formed, a portion of the stack is masked with the mask 610. The mask 610 can be formed using any of a number of techniques. The portion of the stack that is masked is the portion closest to the future air bearing surface 203. Once mask 610 is in place, an ion mill process is used to remove the unmasked portion of the back edge of the stack. The ion milling is stopped after the AP-free layer 340 but before the simple pinned/reference layer 330. The ion milling is depicted as arrows 620. The material removed from the stack is analyzed. When material from layer 338 is detected, the ion milling is stopped within a predetermined amount of time. The detection of layer 338 indicates that the AP-free layer 340 has been passed and that the simple-pinned/reference layer 330 has not yet been reached. This forms the smaller AP-free layer 340 and the larger or extended simple pinned/reference layer 330 as shown in FIGS. 3 and 4. The ion milling procedure leaves the space 360 which is filled with insulating material 362. The mask layer 610 is then removed and the surface polished flat by chemical-mechanical polishing. After removing any surface oxides or contamination using a short ion milling or sputter etch, the insulating material 362 and the cap layer 350 are then covered with the second shield 312 to form the completed read sensor or element 210, as shown in FIG. 3.

Figure 7:
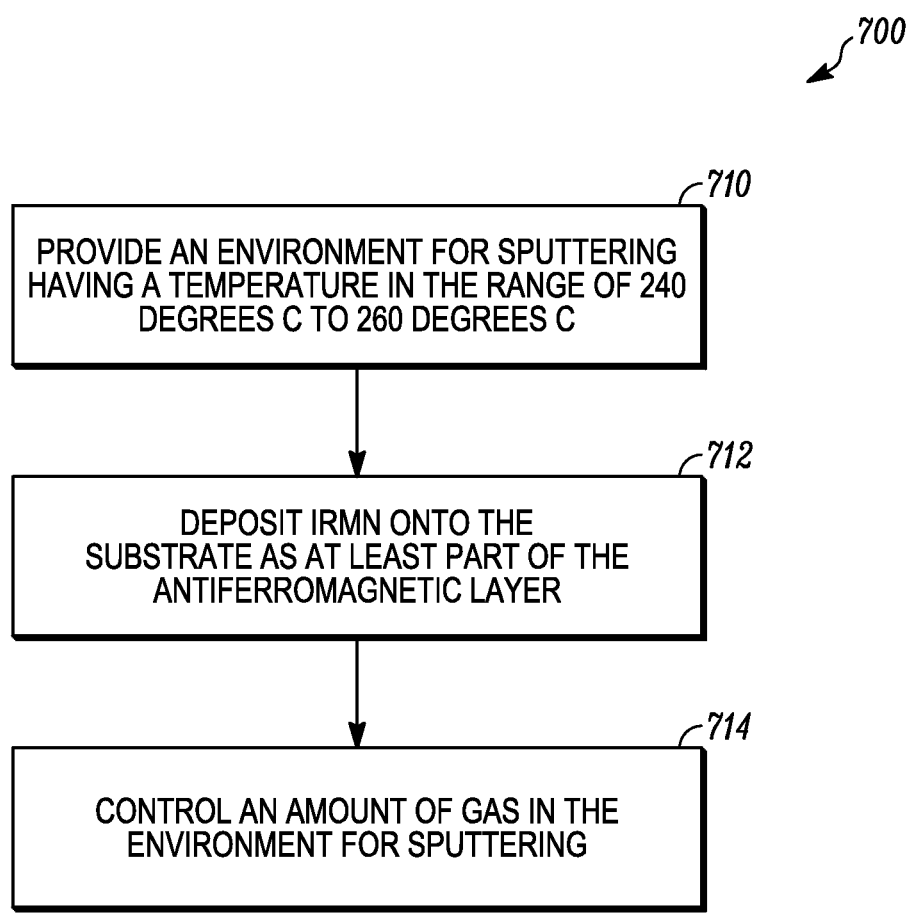
FIG. 7 is a flow chart for a method of forming the AFM that produces a high pinning strength, according to an example embodiment.

FIG. 7 is a flow chart for a method 700 of forming the AFM layer that produces a high pinning strength, according to an example embodiment. In one embodiment, the AFM layer includes a sputtered layer of IrMn. The method 700 includes providing an environment for sputtering 710 having a temperature in the range of 200 degrees C. to 300 degrees C., or about 250 degrees C. In some embodiments, the method also includes depositing IrMn onto the substrate 712 on at least part of the antiferromagnetic layer 712. In one embodiment, the deposition of the IrMn onto the substrate can be controlled by introducing gas into the sputtering chamber or sputtering environment 714. The gas can be Kr gas or Ar gas or similar gases such as Xe or mixtures thereof. The IrMn is deposited onto the substrate as at least part of the anti-ferromagnetic layer. The final desired film composisiton is Ir (21 atomic %)Mn(79 atomic %) with an error bar of 2%

As mentioned above, all the layers are formed by sputtering. The environment is controlled during sputtering. When sputtering the iridium manganese layer 326, the process is controlled to produce an anti-ferromagnetic layer 320 having a high pinning strength. The pinning strength of layer 320 is in a range between 0.5 and 1.5 erg/cm². In one embodiment, the pinning strength of the layer 320 is between 0.9 and 1.3 erg/cm². This high pinning strength is achieved by depositing the anti-ferromagnetic layer 320 onto the substrate at a temperature in the range of 200 degrees C. to 300 degrees C. The anti-ferromagnetic layer 326 includes sputtering of the IrMn layer 326. In another embodiment, the high pinning strength is of the anti-ferromagnetic layer 320 is achieved by depositing IrMn onto the substrate in the presence of Kr or Ar gas at a temperature in the range of 200 degrees C. to 300 degrees C. In other embodiments, the temperature is in the range of 240 degrees C. to 260 degrees C.

Adding Kr gas allows for precisely controlling the composition of the iridium manganese in an optimal range. The resulting magnetoresistive element 210 has an extended simple pinned/reference layer 330. The reference layer 330 and the anti-ferromagnetic layer 320 are extended with respect to the free layer 340. The simple pinned layer 330 is pinned with a relatively high-strength pinning force in the range of 0.5 erg/cm² to 1.5 erg/cm². The extended pinned/reference layer 330 which is pinned with anti-ferromagnetic layer 320 having a high pinning force increases magnetic damping and reduces the effect of spin torque excitations on the pinned layer. In addition having the extended pinned layer designed further reduces the resistance and noise of the sensor 210, and improves the sensor by increasing the magnetic stability of the reference layer 330 and reduces negative asymmetry. In short, a CPP GMR sensor having a simple pinned layer that is pinned with a high pinning strength and in which the pinned layer is also extended with respect to the AP free layer provides a performance boost and improved operation when compared to other sensors.

Figure 8:
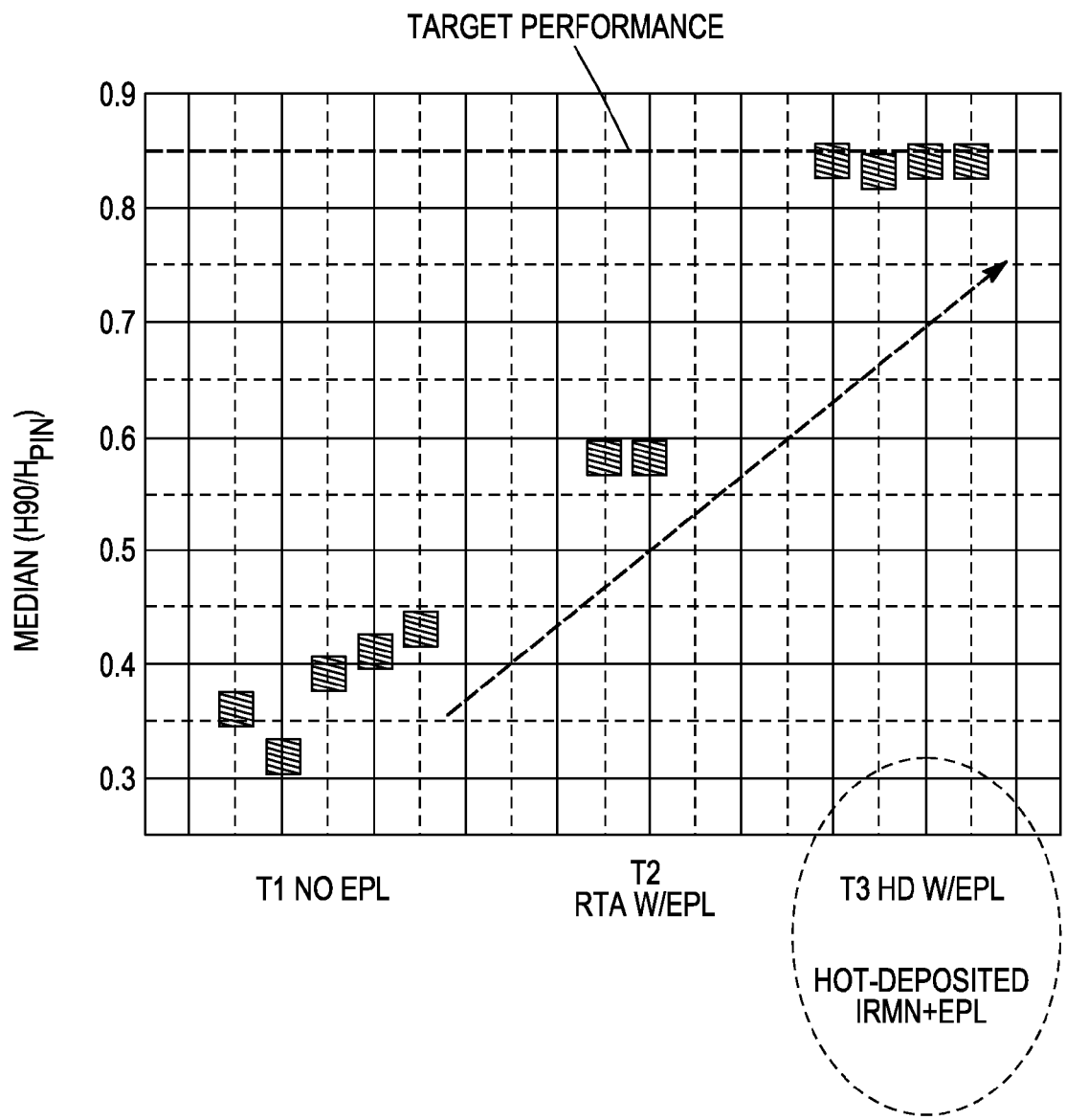
FIG. 8 is diagram showing the performance of the magneto-resistive sensor discussed above compared to other known sensors.
Figure 9:
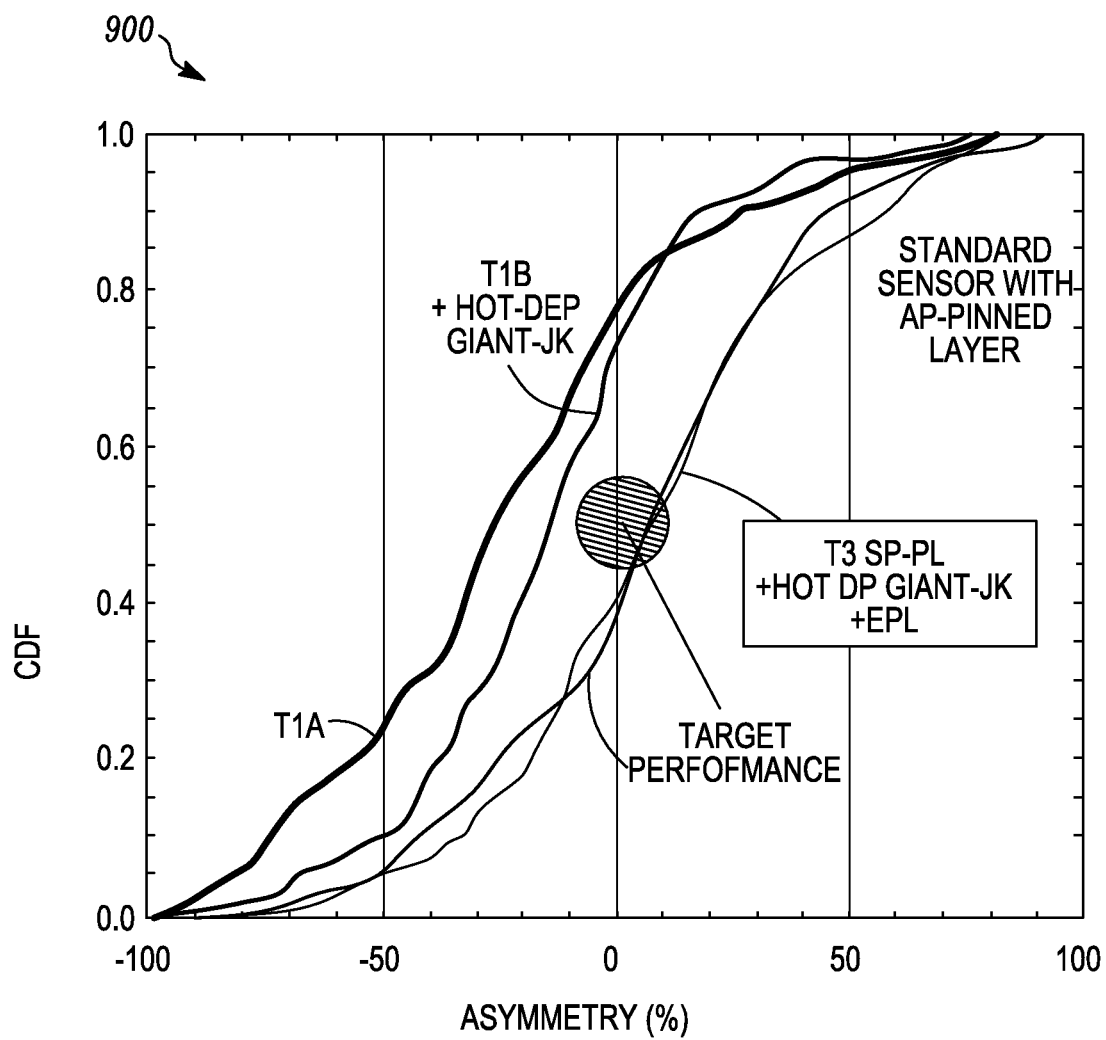
FIG. 9 is a plot showing another performance comparison of the mgneto-resistive sensor of the instant application compared to other known sensors.

FIGS. 8 and 9 are comparisons of the sensor 210 with other sensors or read elements. FIG. 8 is diagram showing the performance of the magneto-resistive sensors having no extended pinning layer, sensors having only the extended pinning layer and sensors having both an extended pinning layer and a hot-deposited IrMn layer which produces a higher pinning strength. When measuring a magnetoresistive transfer curve (resistance vs. applied magnetic field), the resistance will vary between maximum (or 100%) resistance when the net magnetizations of the free and reference layers are antiparallel, to minimum (or 0%) when they are parallel. When the field is applied opposite to the direction of the pinned layer, the magnetization of the free layer will always point in the direction of the field, while the pinned layer magnetization will only rotate in the direction of the applied field for very large field values. A measure or indicator of magnetic stability is a value determined by the magnetic field strength needed to reach 90% resistance (H90), divided by a magnetic field strength needed to reverse the direction of the pinned layer ($H_{pin}$). The higher the number of H90/$H_{pin}$ the better the magnetic stability of the sensor. The higher number, the better the indication of improved pinning strength and improved magnetic stability, as depicted by the arrow on the diagram. As shown, the result of test T1 are for sensors having no extended pinning layer. The H90/$H_{pin}$ ratio is about 0.40. Test T2 shows the results for two sensors formed with extended pinning layers. The H90/$H_{pin}$ improves to about 0.60. The T3 test is for two sensors formed with a combination of extended pinning layer and a hot-deposited IrMn layer. The H90/$H_{pin}$ improves to about 0.85. Advantageously, the result reaches the target performance expected of manufacturable spin-valve sensors such as a standard tunnel-magnetoresistance (TMR) read element or sensor with a standard AP-pinned layer as its reference layer. The resultant sensor, such as described in the above embodiments, has a magnetic stability on par with standard manufacturable sensors.

FIG. 9 is a plot 900 showing the performance of the GMR sensor formed as discussed above compared to other known GMR sensors. The plot 900 shows an additional measure of magnetic performance. Plot 900 is a depiction of the asymmetry distribution (CDF) associated with various magnetoresistive elements or sensors. Asymmetry is a measure of the difference in the signal amplitude between a positive and negative fields from the disk. In other words, a "0" value may be a negative field and a "1" value may a positive value. In perpendicular magnetic recording, the transitions are written perpendicular to the major surface of the disk. A "0" would have a magnetic field that goes into the disk, while a "1" would have a magnetic field that is written in the opposite direction and comes out of the disk. With perfect asymmetry the sensor output amplitude for a "0" will be the same (albeit of opposite polarity) as the sensor output amplitude for the "1". Plot 900 includes a number of measurements for a particular MR element or sensor. A simple pinned layer sensor without an extended pinned layer or enhanced AFM layer has a mean asymmetry (CDF=0.5 or 50%) of approximately −30%. In MR sensor that includes an enhanced AFM layer formed by hot deposition of IrMn has a mean asymmetry of about −20%. The MR sensor 210 formed according to the embodiments described above having the enhanced AFM layer formed by hot deposition of IrMn, and having extended pinned layer has a mean asymmetry of about 0 which is near the ideal value of asymmetry. In other words the mean amplitude of the "1" signal is substantially equal to the amplitude of the "0" when using the MR sensor or MR element 210.

Thus, FIGS. 8 and 9 show very good performance of the MR element or MR sensor 210 shown in FIG. 3, namely a giant MR sensor 210 that includes an extended pinned layer as well as an AFM layer made of IrMn which is hot deposited (deposited at approximately 250 degrees C.). The MR sensor 210 also has the advantage in that all the layers of the sensor are metal layers. The MR sensor 210 thus will have less resistance and therefore less noise than a sensor that will include a insulating layer. The MR sensor 210 will have a high signal-to-noise ratio. The MR sensor 210 also has an additional advantage in that the spacing between the shield 310 and the shield 312 will be in the range of 20-30 nanometers. This is shown as dimension, d, in FIG. 3. A shield to shield spacing of 20-30 nanometers is a smaller spacing than other MR elements of similar performance which include an AP-pinned layer. With this smaller spacing between the shields 310, 312, the density at which the transitions can be written can be increased. Ideally, and MR element or sensor such as MR element 210, has approximately 2 transitions underneath the MR sensor. With such close shield to shield spacing the transitions can be more closely packed.

Of course during a read operation, the transitions in the disk 120 change to reflect different information. This change produces a change in signal output from the read element which can be used to determine the information written to the disk 120. Once information from the disk is determined, it can be decoded and de-serialized and delivered to a host computer as data. A portion of the disk drive 100 is the read/write channel which is used to amplify the signal from the read element 210, correct errors in the information as read, and deliver information to the host computer. The read/write channel also takes information from the host computer, serializes it, puts in a pre-compensation and determines where the information representing data will be written to the disk 120.

A giant magneto resistive sensor includes a first shield layer, an AP (anti-parallel) free layer, a pinned layer, and a second shield layer. The pinned layer has a surface area which is greater the surface associated with the AP free layer. In one embodiment, the giant magneto resistive sensor also includes an anti-ferromagnetic layer for substantially fixing the magnetic orientation of a plurality of domains in the pinned layer. The ferromagnetic layer is adjacent the pinned layer and having a surface area which is greater than at least the free area. The pinned layer is a single magnetic layer. In one embodiment, the pinned layer is a single magnetic layer that includes of a plurality of layers of metal. The AP free layer, the pinned layer, and the second shield layer extend to a common plane called the air bearing surface. The AP free layer extends from the air bearing surface to a first distance. The pinned layer extends from the air bearing surface to a second distance greater than the first distance. In another embodiment, the giant magneto resistive sensor also includes an anti-ferromagnetic layer. The anti-ferromagnetic layer also extends from the air bearing surface to the second distance greater than the first distance. In one example embodiment, the distance between the first shield layer and the second shield layer is in the range of 20-30 nanometers. In another example embodiment, the distance between the first shield layer and the second shield layer is in the range of 25-28 nanometers. In another example embodiment, the anti-ferromagnetic layer includes IrMn sputtered onto a substrate in an environment that includes Kr gas. The environment also has a temperature of about 250 degrees C. The anti-ferromagnetic layer has a pinning strength in the range of 0.5 erg/cm^2 to 1.5 erg/cm^2. The layers of material between the pinned layer and the second shield layer are metal layers.

A disk drive also includes means for forming a giant magneto resistive sensor which also includes means for depositing layers of material on a substrate. The layers of material include a first shield layer, an AP free layer, a pinned layer, an anti-ferromagnetic layer, and a second shield layer. The apparatus also includes means for removing a portion of the AP free layer deposited to produce a structure where the pinned layer has a surface area that is larger than the AP free layer. In one embodiment the layers from a stack. The apparatus also includes means for removing the portion of the free layer and means for masking a portion of the stack of deposited layers. The apparatus also includes an ion milling means for removing the unmasked portion of the stack of deposited layers. The mask, in one embodiment, is placed over a portion of the stack that will become a future air bearing surface. The removed portion of the stack is replaced with an insulating material.

Depositing the anti-ferromagnetic layer is deposited in an environment having a temperature in the range of 200 degrees C. to 300 degrees C. In some embodiments the anti-ferromagnetic layer is deposited in an environment having a temperature in the range of 240 degrees C. to 260 degrees C. In some embodiments, sputtering IrMn onto the substrate in the presence of Kr gas is done at a temperature in the range of 240 degrees C. to 260 degrees C.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

While the embodiments have been described in terms of several particular embodiments, there are alterations, permutations, and equivalents, which fall within the scope of these general concepts. It should also be noted that there are many alternative ways of implementing the methods and apparatuses of the present embodiments. It is therefore intended that the following appended claims be interpreted as including all such alterations, permutations, and equivalents as fall within the true spirit and scope of the described embodiments.

What is claimed:

1. A giant magneto resistive sensor comprising:
   a first shield layer;
   an AP (anti-parallel) free layer;
   a pinned layer;
   an anti-ferromagnetic layer, the pinned layer and the anti-ferromagnetic layer having a surface area greater than at least the AP free layer, the surface area of the pinned layer and the anti-ferromagnetic layer being at least 2.0 to 7.0 greater than the surface of the AP free layer; and
   a second shield layer, the first shield layer, the AP free layer, the pinned layer, the anti-ferromagnetic layer, and the second shield layer extending to an air bearing surface, and being in substantially parallel planes.

2. The giant magneto resistive sensor of claim 1 further comprising an anti-ferromagnetic layer for substantially fixing the magnetic orientation of a plurality of domains in the pinned layer, the anti-ferromagnetic layer adjacent the pinned layer and having a surface area which is greater than at least the AP free layer.

3. The giant magneto resistive sensor of claim 1 wherein the pinned layer is a single magnetic layer.

4. The giant magneto resistive sensor of claim 1 wherein the pinned layer is a single magnetic layer comprised of a plurality of layers of metal.

5. The giant magneto resistive sensor of claim 1 wherein the first shield layer, the AP free layer, the pinned layer, and the second shield layer extend to a common plane called the air bearing surface, the AP free layer extending from the air bearing surface to a first distance and the pinned layer extending from the air bearing surface to a second distance greater than the first distance.

6. The giant magneto resistive sensor of claim 1 further comprising an anti-ferromagnetic layer, wherein the first shield layer, the AP free layer, the pinned layer, the anti-ferromagnetic layer, and the second shield layer extend to a common plane called the air bearing surface, the AP free layer extending from the air bearing surface to a first distance, the pinned layer and the anti-ferromagnetic layer extending from the air bearing surface to a second distance greater than the first distance.

7. The giant magneto resistive sensor of claim 1 further comprising a plurality of layers of material between the pinned layer and the second shield layer, the plurality of layers being metal layers.

8. The giant magneto resistive sensor of claim 1 wherein the distance between the first shield layer and the second shield layer is in the range of 20-30 nanometers.

9. The giant magneto resistive sensor of claim 1 wherein the distance between the first shield layer and the second shield layer is in the range of 25-28 nanometers.

10. The giant magneto resistive sensor of claim 1 comprising anti-ferromagnetic layer for fixing the magnetic orientation of a plurality of domains in the AP pinned layer, the anti-ferromagnetic layer including IrMn sputtered onto a substrate in an having a temperature of about 250 degrees C.

11. The giant magneto resistive sensor of claim 1 further comprising an anti-ferromagnetic layer for substantially fixing the magnetic orientation of a plurality of domains in the pinned layer, the anti-ferromagnetic layer having a pinning strength in the range between 0.5 and 1.5 erg/cm$^2$.

12. A disk drive comprising:
a disk including a magnetizable layer of material;
a transducer positionable with respect to the disk in transducing relation with the disk, the transducer comprising a read element including:
a first shield layer;
an AP (anti-parallel) free layer;
a pinned layer;
an anti-ferromagnetic layer, the pinned layer and the anti-ferromagnetic layer having a surface area greater than at least the AP free layer, the surface area of the pinned layer and the anti-ferromagnetic layer being at least 2.0 to 7.0 greater than the surface of the AP free layer; and
a second shield layer, the first shield layer, the AP free layer, the pinned layer, the anti-ferromagnetic layer, and the second shield layer extending to an air bearing surface, and being in substantially parallel planes.

13. The disk drive of claim 12 wherein the read element further comprises an anti-ferromagnetic layer for substantially fixing the magnetic orientation of a plurality of domains in the pinned layer, the ferromagnetic layer adjacent the pinned layer, the pinned layer having a surface area which is greater than the area associated with the AP free layer, and the anti-ferromagnetic layer having a surface area which is greater than the area associated with the AP free layer.

14. The disk drive of claim 13 wherein the anti-ferromagnetic layer for substantially fixing the magnetic orientation of a plurality of domains in the AP pinned layer has a pinning strength in the range of 0.5 erg/cm$^2$ to 1.5 erg/cm$^2$.

* * * * *